US010588241B2

(12) United States Patent
Goergen et al.

(10) Patent No.: US 10,588,241 B2
(45) Date of Patent: Mar. 10, 2020

(54) COOLING FAN CONTROL IN A MODULAR ELECTRONIC SYSTEM DURING ONLINE INSERTION AND REMOVAL

(71) Applicant: CISCO TECHNOLOGY, INC., San Jose, CA (US)

(72) Inventors: Joel Richard Goergen, Soulsbyville, CA (US); Emanuele Umberto Giacometti, Turin (IT); James Alexander Markevitch, Palo Alto, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 133 days.

(21) Appl. No.: 15/977,026

(22) Filed: May 11, 2018

(65) Prior Publication Data
US 2019/0350106 A1    Nov. 14, 2019

(51) Int. Cl.
| H05K 7/20 | (2006.01) |
| G05D 7/06 | (2006.01) |
| G05B 15/02 | (2006.01) |
| H05K 5/02 | (2006.01) |

(52) U.S. Cl.
CPC ......... *H05K 7/20209* (2013.01); *G05B 15/02* (2013.01); *G05D 7/0676* (2013.01); *H05K 5/0226* (2013.01)

(58) Field of Classification Search
CPC ... H05K 7/20209; G05B 15/02; G05D 7/0676
See application file for complete search history.

(56) References Cited

U.S. PATENT DOCUMENTS

| 6,008,995 A | 12/1999 | Pusateri et al. |
| 6,855,881 B2 | 2/2005 | Khoshnood |
| 6,966,786 B1 | 11/2005 | Motojima et al. |
| 7,108,559 B2 | 9/2006 | Shtargot et al. |
| 7,224,588 B2 | 5/2007 | Nieman et al. |
| 7,277,296 B2 | 10/2007 | Ice |
| 7,344,439 B2 * | 3/2008 | Henry ................. H05K 7/1445 361/679.48 |
| 8,276,397 B1 | 10/2012 | Carlson et al. |
| 8,700,923 B2 | 4/2014 | Fung |
| 8,842,430 B2 | 9/2014 | Hellriegel et al. |
| 9,203,188 B1 | 12/2015 | Siechen et al. |
| 9,273,906 B2 | 3/2016 | Goth et al. |
| 9,456,517 B2 | 9/2016 | Laufer et al. |
| 9,510,479 B2 | 11/2016 | Vos |
| 9,585,283 B2 | 2/2017 | Chia et al. |
| 9,693,244 B2 | 6/2017 | Maruhashi et al. |
| 9,723,745 B2 | 8/2017 | Qi et al. |
| 9,904,336 B1 * | 2/2018 | Khan ...................... G06F 1/206 |
| 2008/0010471 A1 * | 1/2008 | Aksamit ................... G06F 1/26 713/300 |

(Continued)

*Primary Examiner* — Vincent H Tran
(74) *Attorney, Agent, or Firm* — Cindy Kaplan (57) ABSTRACT

In one embodiment, a method includes identifying removal of a module from a network device comprising a plurality of fans during an online removal process while the network device is operational, reducing fan speed in the network device to allow a hinged door to move to a closed position covering an opening from which the module was removed, and increasing the fan speed to maintain cooling in the network device.

20 Claims, 7 Drawing Sheets

(56) References Cited

U.S. PATENT DOCUMENTS

| | | | |
|---|---|---|---|
| 2008/0291621 A1* | 11/2008 | Regimbal | G06F 1/206 361/679.41 |
| 2009/0034187 A1* | 2/2009 | Coles | H05K 7/20736 361/679.48 |
| 2010/0110632 A1* | 5/2010 | Rose | H05K 7/20727 361/695 |
| 2012/0064745 A1 | 3/2012 | Ottliczky | |
| 2012/0201089 A1 | 8/2012 | Barth et al. | |
| 2013/0077023 A1 | 3/2013 | Peeters Weem et al. | |
| 2013/0077923 A1 | 3/2013 | Peeters Weem et al. | |
| 2013/0155612 A1* | 6/2013 | Korikawa | H05K 7/20145 361/692 |
| 2014/0092541 A1* | 4/2014 | Zhang | G06F 1/20 361/679.5 |
| 2016/0262288 A1 | 9/2016 | Chainer et al. | |
| 2019/0073006 A1* | 3/2019 | Chang | G06F 1/206 |

\* cited by examiner

COOLING FAN CONTROL IN A MODULAR ELECTRONIC SYSTEM DURING ONLINE INSERTION AND REMOVAL

TECHNICAL FIELD

The present disclosure relates generally to network communications devices, and more particularly, to cooling fan control in modular electronic systems during online insertion and removal of modules.

BACKGROUND

Network communications systems utilize network devices that include complex and sensitive electronic components that require cooling, which is often provided by fans. Modular electronic systems are designed to provide flexibility to configure systems as per user needs. These systems typically have multiple slots to accommodate a variety of modules. It is desirable to replace the modules without powering down the system or impacting the performance of other modules in the system, such as by disrupting system cooling.

BRIEF DESCRIPTION OF THE DRAWINGS

Corresponding reference characters indicate corresponding parts throughout the several views of the drawings.

DESCRIPTION OF EXAMPLE EMBODIMENTS

Overview

In one embodiment, a method generally comprises identifying removal of a module from a network device comprising a plurality of fans during an online removal process while the network device is operational, reducing fan speed in the network device to allow a hinged door to move to a closed position covering an opening from which the module was removed, and increasing the fan speed to maintain cooling in the network device.

In another embodiment, logic is encoded on one or more non-transitory computer readable media for execution and when executed by a processor operable to identify removal of a module from a network device comprising a plurality of fans during an online removal process while the network device is operational, reduce fan speed in the network device to allow a hinged door to move to a closed position to cover an opening from which the module was removed, and increase the fan speed to maintain cooling in the network device.

In yet another embodiment, a method generally comprises receiving an indication at a network device of initiation of online removal for a module removably inserted into an opening of the network device, the network device comprising a plurality of fans, reducing a speed of at least one of the fans to allow removal of the module from the network device, and increasing the speed of at least one of the fans.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network devices such as switches, routers, server racks, or other electronic devices may be configured as a modular electronic system with a plurality of removable modules (e.g., service cards, line cards, fabric cards, power supply units (PSUs), fans (fan trays), filters, or other cards, components, or modules). In a modular configuration system, Online Insertion and Removal (OIR) (also referred to herein as online removal) describes a process of replacing a module for repair or replacement (e.g., product upgrade, failed module replacement) while the network device is operational, without disrupting the performance of the modular system. During this process, the system continues to be functional and a faulty module is replaced with a new or repaired module.

In an air-cooled modular electronic system, cooling air is supplied to each of the modules to maintain a normal cool state of each module. Depending on the complexity of the system design, the OIR process may take some time (e.g., about five minutes). If the slot is left open, ambient air would be allowed to rush into the slot. In a fan cooled system that is optimized for uniform flow through each of the slots, airflow would be negatively impacted as the slot opening would offer the least resistance airflow path and most of the air would start flowing through that open slot. This would reduce the airflow for other modules, thereby causing their component temperatures to rise, which often leads to overheating, and may potentially result in shorter life span or catastrophic failure of one or more of the operational modules remaining in the system.

In order to prevent loss of cooling during the OIR process, a door may cover the opening after the module is removed. For example, a flap door may be hinged at an edge of the chassis and swing into the chassis to allow for easy insertion of the module by pushing the door out of the way on entry. However, due to the air flow within the system, the door may become stabilized in an open position when the module is removed due to reverse flow air pressure during an OIR operation.

The embodiments described herein provide fan control to allow a door to move to a closed position covering an opening from which a module is removed and remain in the closed position during online insertion and removal when fan speeds may need to reach a high speed to continue cooling active components in a modular electronic system. In one or more embodiments, fan speed may also be reduced before module removal to allow for easy removal of the module, with the fan speed increased after the module is removed or when the door covering the module opening is closed.

Figure 1:
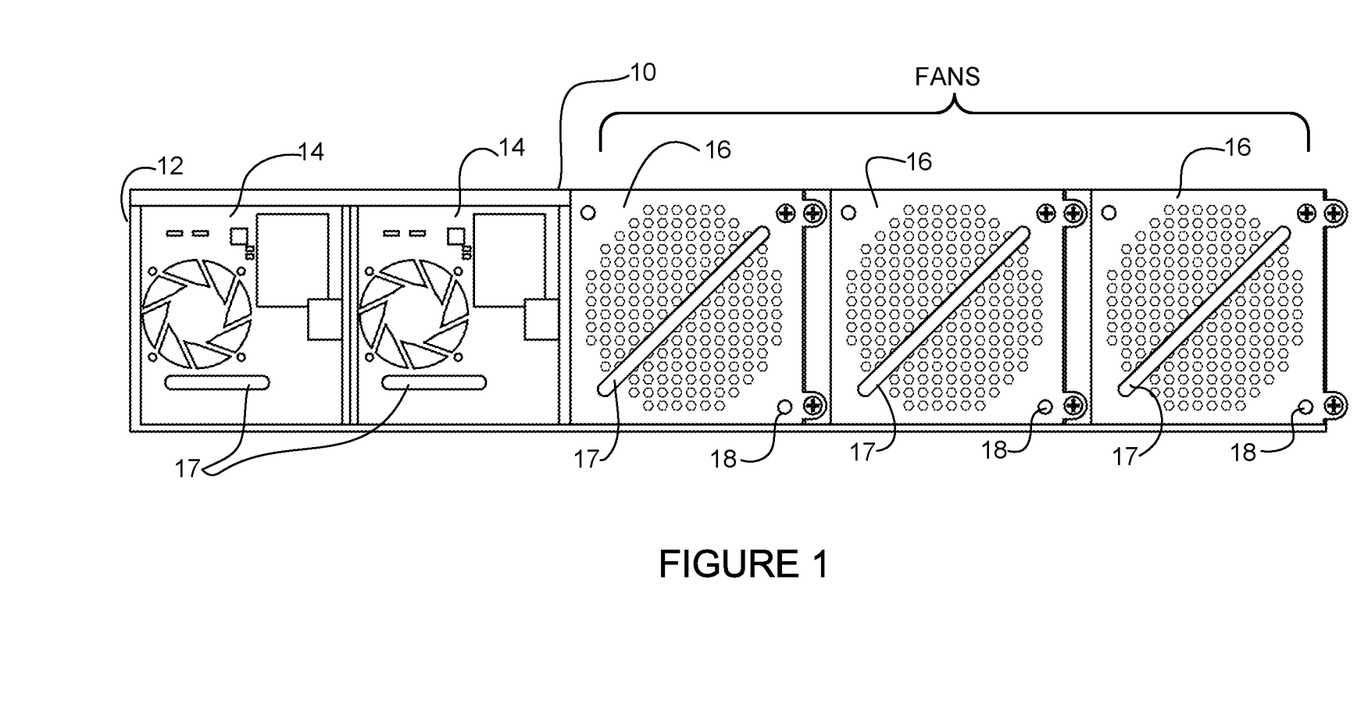
FIG. 1 is a rear view of a modular electronic system, in accordance with one embodiment.

Referring now to the drawings, and first to FIG. 1, an example of a network device (modular electronic system) 10 that may implement the embodiments described herein is shown. The modular electronic system 10 may operate, for example, as a switch, router, server, or any other network device comprising modules (components, cards, trays, elements) included in modular sections. In one or more embodiments, the network device operates in a data communications network including multiple network devices that may communicate over one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet, intranet, radio access network, public switched network, or any other network).

Figure 2:
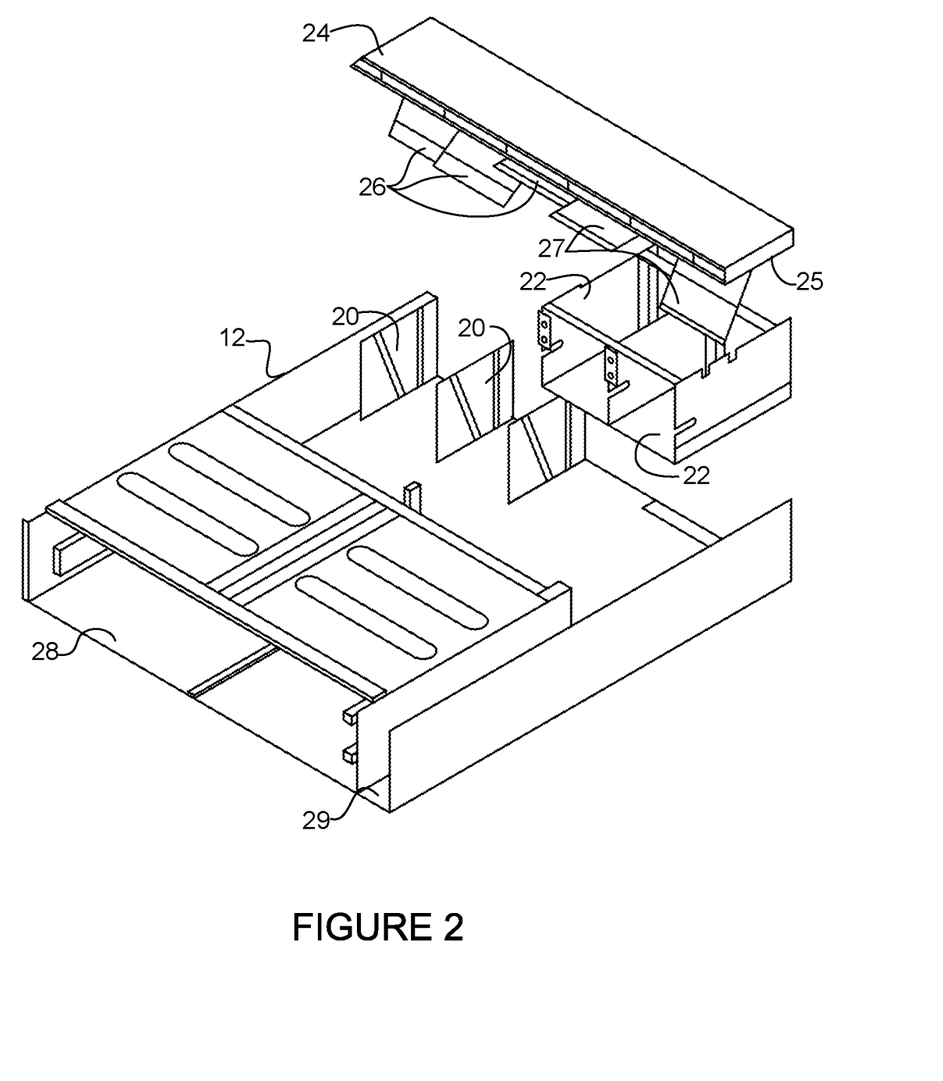
FIG. 2 is an exploded view of a frame and door assembly of the modular electronic system of FIG. 1, in accordance with one embodiment.

As shown in FIG. 1, the modular electronic system 10 comprises a plurality of modules 14, 16 contained within a frame 12. The system 10 may include one or more frames or structures 12 configured to support various components and slidably receive any number of removable modules. FIG. 1 is a rear view of one example of the modular electronic system 10 comprising two power components (PSUs) 14 and three fan trays (fans) 16. Each fan try may comprise one or more fans. In one example, each module 14, 16 may comprise a handle 17 for ease of removal of the module. As shown in FIG. 2 and described below, a front portion of the frame 12 also includes openings for receiving a plurality of line cards (e.g., fabric cards, line cards, service cards, combo cards, controller card). It is to be understood that the type, number, and arrangement of components and modules shown and described herein is only an example and the network device 10 may include any number or type of modules arranged in any format.

One or more of the modules 14, 16 shown in FIG. 1 may be removed for repair or replacement while the other components remain operational. The term OIR (online insertion and removal) or online removal as used herein refers to removal of a module from the network device 10 without removing power from the device (i.e., one or more remaining modules are operational). One or more of the modules may be removed during the OIR process. As previously noted, it is important to maintain cooling within the network device 10 during the OIR process to prevent failure or degradation of performance of the remaining active components.

As described below, the frame structure may comprise a hinged door that is easily pushed out of the way during insertion of the module 14, 16 and configured to swing into the opening upon removal of the module to substantially close the opening (slot) once the module is removed to maintain cooling within the network device. For example, a flap door may be hinged at an upper edge of the chassis and swing up into the chassis to allow for easy insertion of the module by pushing the door out of the way on entry, and fall down into the opening when the module is removed. If the remaining fans operate at a high speed (RPM (revolutions per minute)), the air flow may prevent the door from reaching its closed position. As described in detail below, fan speed is temporarily reduced to allow the door to close.

In one or more embodiments, an indication may be provided to notify a user (technician, operator) of a status of a module or door. For example, the network device 10 may comprise a display or light on the chassis itself or each module. In the example shown in FIG. 1, each fan tray 16 includes an indicator 18 (e.g., LED (Light Emitting Diode) or other light or element) operable to indicate a status of the module or an adjacent door. For example, if the indicator light 18 is located on the removable module, the light may change color or flash depending on the status of the door for an adjacent module that has been removed. The LED may also be located on the frame and viewable from the rear of the network device 10 or on a front panel of the network device. The indicator light 18 may be used to inform a technician that a door covering an opening from which a module has been removed has properly latched in its closed position or to inform the technician that the door is still open. The LED 18 may also be used to indicate when it is acceptable to remove a module after initiation of an online removal process.

Figure 4A:
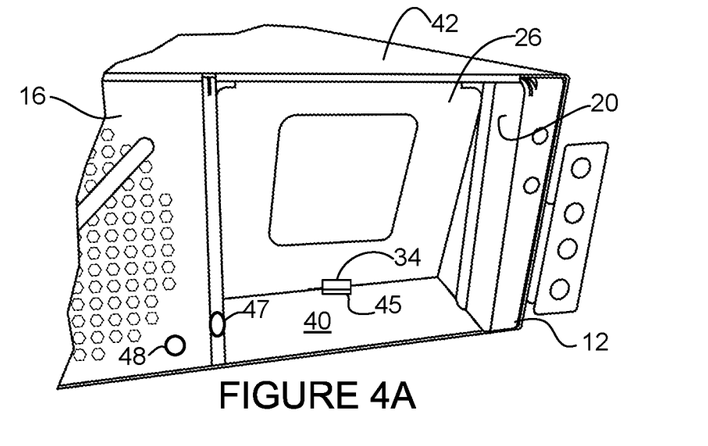
FIG. 4A shows a portion of the modular electronic system of FIG. 1 with a fan tray removed and a fan tray door in a closed position.
Figure 4B:
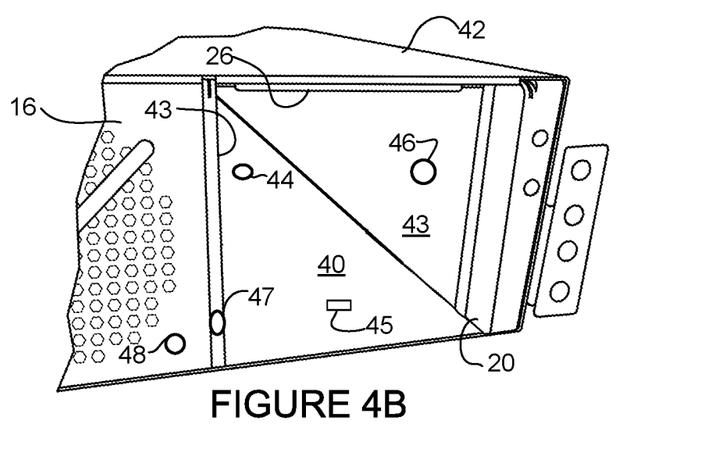
FIG. 4B shows the modular electronic system of FIG. 4A with the fan tray door in an open position.

Referring now to FIG. 2, the frame 12 of the modular electronic system 10 of FIG. 1 is shown in an exploded view with a door assembly 24. The frame 12 comprises a plurality of slots 20, 22 for receiving the fan trays 16 and power components 14, respectively. The door assembly 24 comprises a plurality of hinged doors (flaps, panels) 26, 27 and is mounted to the frame 12 such that the doors are free to rotate downward and substantially cover the openings 20, 22 when the modules are removed (as shown in FIG. 4A) and rotate inward (upward) generally flat against an underside 25 of the door assembly 24 (as shown in FIG. 4B) as the modules are inserted into their respective slots. The term "hinged door" as used herein refers to a door that is rotatable (free to rotate, swing) between an open and closed position. The door rotates downward upon removal of the module without the use of springs or other mechanisms, which would make insertion of the module more difficult and take up space that may not be available. FIG. 2 shows the doors 26, 27 rotated in various positions for illustration purposes. The frame 12 also includes openings 28, 29 for receiving line cards and a controller card, or any other module or component on a front side of the modular electronic system.

Figure 3:
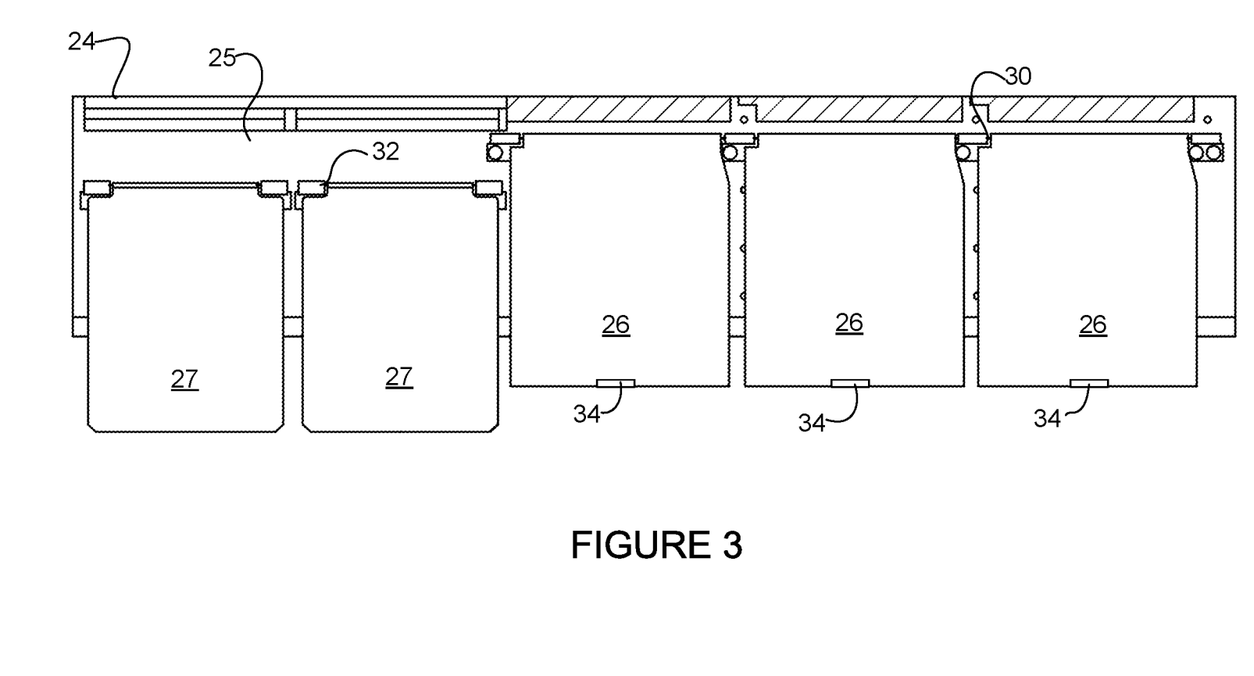
FIG. 3 shows the door assembly of FIG. 3 with the doors in an open position.

FIG. 3 shows the door assembly 24 with the doors 26, 27 rotated up against the underside 25 of the door assembly. The fan doors 26 rotate about hinges 30 and the PSU doors 27 rotate about hinges 32. The doors 26, 27 may comprise, for example, a thin panel formed from metal with a cylindrical or U-shaped upper portion (e.g., fingers or continuous slot or loop) for receiving a hinge pin connected to the door assembly at hinges 30, 32.

The fan tray doors 26 may also include magnets 34 (on either side of the door or lower edge of the door) for latching the door in a closed position when it contacts a lower panel of the frame. The magnets 34 may instead be located on a lower panel of the frame and positioned to latch the door as it swings towards its closed position. The PSU doors 27 may also include magnets, if needed.

It is to be understood that the network device 10 shown in FIG. 1 and the frame structure shown in FIGS. 2 and 3 are only examples and that the embodiments described herein may be implemented in other modular electronic systems with different types of modules, number of modules, arrangement of modules, or configurations, without departing from the scope of the embodiments.

Figure 4C:
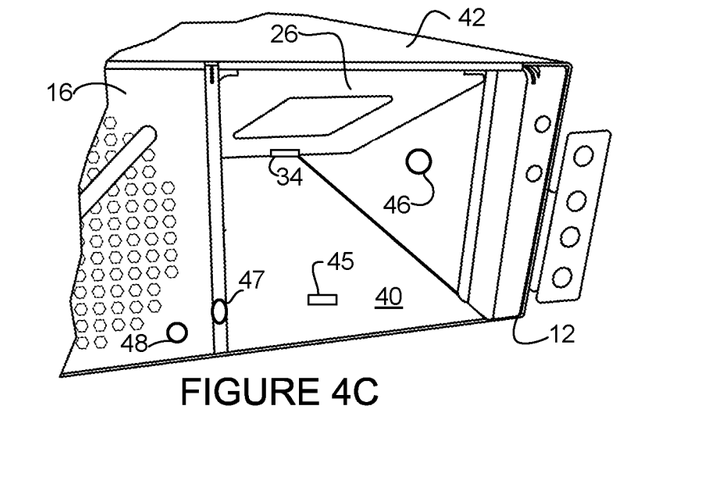
FIG. 4C shows the modular electronic system of FIG. 4A with the fan tray door in a partially open position.

FIGS. 4A-4C are perspective rear views of a portion of the modular electronic system 10 shown in FIG. 1, illustrating the fan tray door 26 in a closed position (FIG. 4A), open position (FIG. 4B), and partially open (partially closed) position (FIG. 4C) within fan tray slot (opening) 20 of frame 12 with the fan tray removed. Adjacent fan tray 16 is installed and as previously described, is still operational during the online removal process.

The fan tray opening 20 is formed by lower panel 40, upper panel 42 and side walls 43. When the fan tray 16 is inserted into the opening, the fan tray engages with the hinged door 26, which is easily rotated up against the upper panel 42 and out of the way of the fan tray, as shown in FIG. 4B (fan tray not shown to illustrate door position). With no power applied to the network device (e.g., no fans operating), the door 26 is free to rotate downward upon removal of the fan tray 16 to close the opening 20 as shown in FIG. 4A. In one or more embodiments, the magnet 34 is placed on an edge margin of the door 26 so that the door latches in place against lower panel 40 once it reaches is closed position (FIG. 4A). However, the door 26 may never make it to a position wherein the magnet 34 can latch the door in its closed position. For example, during normal OIR operation with the network device operational, the air flow through the system may prevent the door 26 from closing, as shown in FIG. 4C. In normal operation, the fans within the remaining fan trays 16 are all moving air outward at high velocity. During OIR, the fan speed is preferably increased (e.g., from nominal 50% to 100%) to prevent the loss of cooling to the active modules. Due to the air suction from adjacent fans spinning at a high speed, the door 26 may stay open (or partially open) and fail to latch in its closed position. For example, as shown in FIG. 4C, the door 26 may be in a position angled down from the upper panel 42 but too far away from the lower panel 40 for the magnet 34 to latch the door in its closed position. This condition severely limits the cooling performance in the system.

The embodiments described herein operate to reduce air flow for a short period of time (e.g., specified time or until the door 26 is latched in its closed position) by reducing fan speed to allow the door to reach its closed position (FIG. 4A). Once the door is closed, the magnet 34 maintains the door in its closed position when the fan speed is increased. As noted above, the magnet may be located on the lower panel 40 instead of the door 26. The cooling fans are controlled (as described below with respect to the flowcharts of FIGS. 5 and 6) to ensure that the fan tray door 26 is latched in its closed position to maintain cooling within the network device during the online insertion and removal process.

A fan controller (e.g., control logic) may receive input from one or more sensors to identify when the module is removed or about to be removed (e.g., an online process is initiated), when the door closes, or when the door opens. In one example, a module sensor 44 (e.g., optical sensor, switch) may be located within the module opening 20 (e.g., on lower panel 40 as shown in FIG. 4B) to indicate removal of the fan tray 16. As described below, the controller may use this information to begin the process of reducing fan speed to allow the door 26 to close. A micro switch 45 may be positioned on the lower panel 40 to identify when the door 26 has closed. Other sensors may also be used to indicate door closure or opening of the door. For example, a light sensor 46 may be used to indicate the amount of light (e.g., lumens) entering the opening 20 from outside, thereby indicating the door is at least partially open. In another example, an air flow detector 47 may be positioned outside of the opening 20 (e.g., near the door 26 or along an edge of the inner wall past the door closure point) to detect air escaping from the open door 26. The light sensor 46 or air flow detector 47 may also be used to verify that the door 26 has closed (or has not opened after initially closing) and may be used in place of the door closure switch 45. The sensors 44, 45, 46, 47 provide electrical input to the controller, as described below.

It is to be understood that the sensors, combination of sensors, and location of sensors shown in FIGS. 4A-4C is only an example and that other types of sensors or mounting locations of sensors may be used without departing from the scope of the embodiments. Also, only one of the switch 45, light sensor 46, and air flow sensor 47 may be included in the opening 20 for detecting door closure or opening.

The controller may also transmit a signal to a visual indicator on the chassis to identify the status of the door (i.e., closed or open) after the module is removed. In the example shown in FIGS. 4A-4C, LED 48 may be used to indicate the status of the door for the adjacent module that has been removed. LED 48 may change color or change from flashing to solid when the adjacent door 26 is closed. Similarly, the LED 48 may change color or flash if the door 26 fails to close. Any type of signal (e.g., flashing condition, repetition rate, change in color) may be used to alert the operator that the door has latched properly or is still open. For example, once the door has latched closed (e.g., as indicated by the micro switch 45, light sensor 46, or air flow sensor 47) the LED may change color or switch from flashing to steady. The LED 48 may also be used to inform the technician that the door is still open or has not closed within a specified time period. In one or more embodiments, the door 26 may include a handle or lever to allow the technician to manually close the door upon being alerted by the LED 48 that the door is stuck open. It is to be understood that the visual indicators described herein are only examples and that any other type of light or other indicator may be used to alert the technician that the door has closed or that the door is still open.

In one or more embodiments, the controller may receive input upon an operator initiating online removal of the module and reduce fan speed before the module is removed to reduce the force required to remove the module from the chassis. As previously noted, when the fans operate at high speeds, a suction force is created, which increases the force required to remove the module. It is much easier to remove a module when there is no airflow (or reduced airflow). In one example, the network device may comprise an OIR button for use in indicating that a module is about to be removed. The OIR button may be in communication (e.g., mechanically, electronically, or both) with logic operable to reduce fan speed within the modular electronic system prior to removal of the module.

Figure 5:
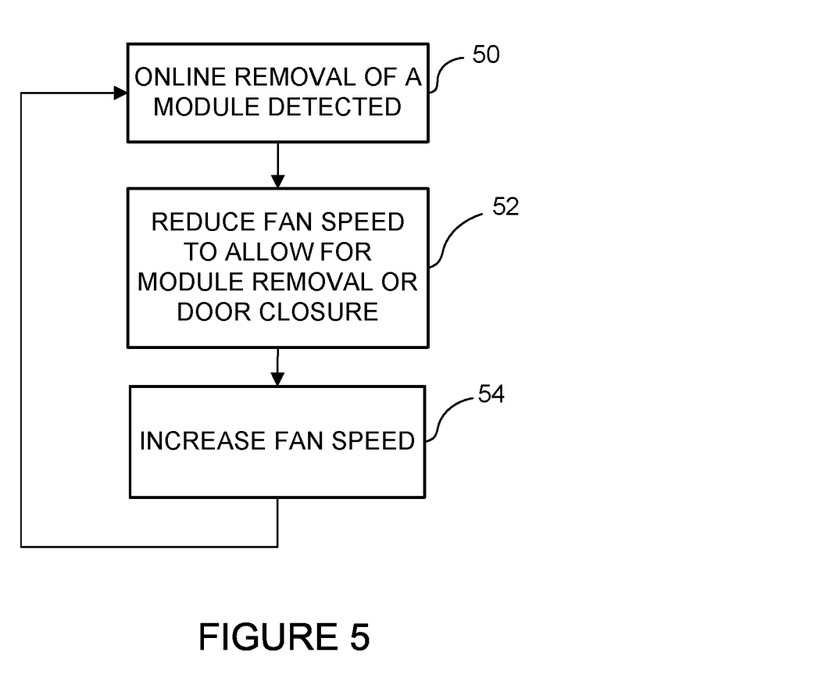
FIG. 5 is a flowchart illustrating an overview of a process for controlling a cooling fan during online insertion and removal of a module from the modular electronic system, in accordance with one embodiment.

FIG. 5 is a flowchart illustrating an overview of a process for cooling fan control in a modular electronic system during module removal, in accordance with one embodiment. At step 50, online removal of a module is detected. This may comprise, for example, detection by a sensor of removal of a module or selection of an online removal button to initiate an online removal process. The fan speed is reduced (e.g., stop one or more fans, reduce the speed of one or more fans, or a combination thereof) to allow for module removal or door closure after the module has been removed (step 52). As described below, the fan speed may be reduced for a set period of time or until the door is properly closed. The fan speed is then increased (e.g., increase speed of one or more fans, restart one or more fans, or a combination thereof) (step 54).

Figure 6:
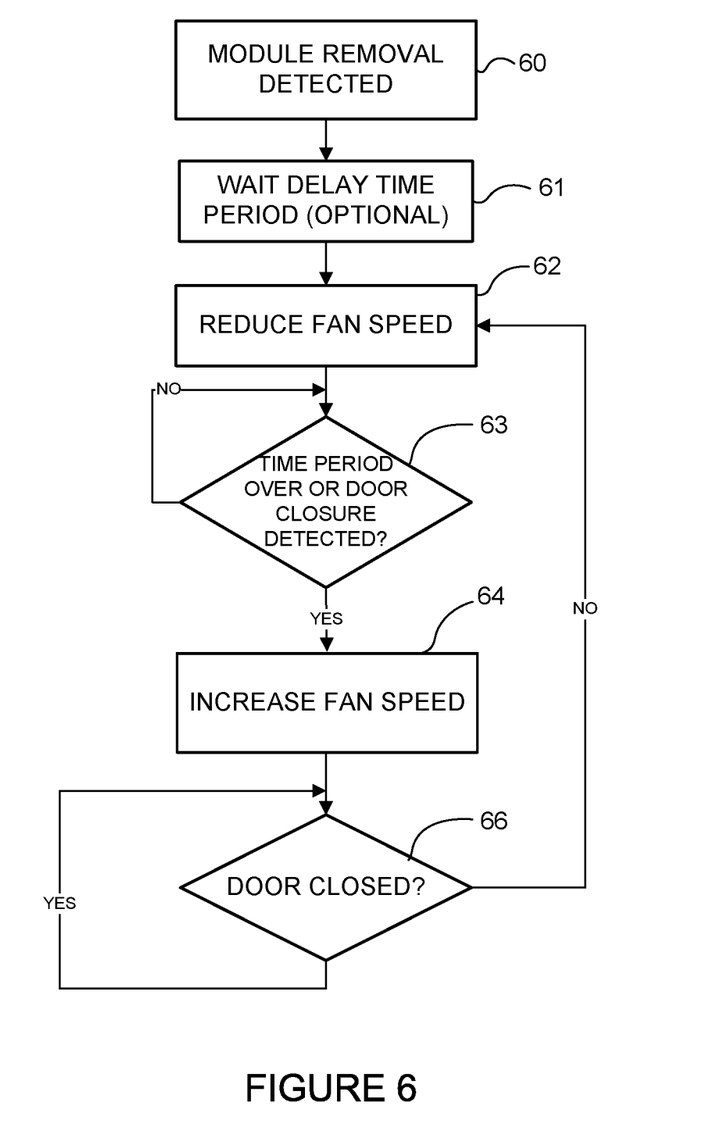
FIG. 6 is a flowchart illustrating a process for controlling the cooling fan to allow for closure of the fan tray door during online removal of the fan tray, in accordance with one embodiment.

FIG. 6 is a flowchart illustrating details of the process shown in FIG. 5, in accordance with one embodiment. At step 60, module removal is detected. The module may be, for example, the fan tray 16 shown in FIG. 1. Removal of the fan tray 16 may be detected by the sensor 44 located within the module opening 20, as described above with respect to FIGS. 4A-4C. In one embodiment, a delay may be inserted after the controller receives a signal indicating that the fan tray has been removed and before reducing fan speed (step 61). For example, a delay of five seconds (or any other time period) may be used to prevent a technician from thinking that they broke the system by removing a fan tray if the fan speed is immediately reduced. The delay may be used to indicate to the technician that the reduction in fan speed is a normal response. It is to be understood that the delay (step 61) is optional and the fan speed may be reduced immediately upon the controller receiving an indication that the fan tray 16 has been removed. The LEDs 18 on the other fan trays 16 preferably remain solid to indicate normal operation when the fan speed is reduced (FIGS. 1 and 6).

After the specified delay (if implemented), fan speed is reduced (step 62). Reduction in fan speed may involve reducing the RPM of one or more of the remaining fans (e.g., slow to 10% of full speed or any other percentage), stopping one or more of the remaining fans, or reducing the RPM of one or more fans and stopping one or more other fans. In one embodiment, the air flow is reduced for a period of time that will allow the door 26 to reach its closed position (FIG. 4A). This time period may be a specified time period or until door closure is detected (step 63). In one example, the time period may be anywhere from one second to more than ten seconds, or any other suitable time period. The time period may be set based on testing and may vary based on the size or weight of the door and the fan speed settings. In another example, the air flow is reduced until door closure is detected. For example, micro switch 45 may be used to detect when the door contacts the lower panel 40 of the chassis (FIG. 4A). This will allow the fan speed to be increased at the earliest possible time. A maximum specified time period may also be used as a backup in case door closure is never detected (e.g., due to broken door, foreign object stuck in the door preventing it to close, or broken sensor). This will enable the fan speed to be increased even if the door sensor never indicates the door is closed.

Once closure of the door is detected or the time period has ended, the fan speed is increased and the air flow may resume at the appropriate defined speed (e.g., increase fan speed to 100% or any other appropriate percentage used for the OIR process) (step 64). The fan speed is increased to maintain cooling within the network device with a reduced number of fans operating.

In one embodiment, the system may verify that the door 26 is closed or identify if the door is opened after initially closing (step 66). It is important to ensure that the door remains closed during the fan tray OIR (e.g., typically about 5 minutes). Using, for example, the switch 45, light sensor 46, or air flow sensor 47, opening of the door 26 may be detected. If the flap door is still partially open, the system may wait for a specified time period and then again reduce the fan speed and repeat the process in another attempt to close the door (steps 62-66). This process may repeat for a set number of times, after which the fans are no longer slowed or shut down to try to close the door. At this point, all remaining fans may be increased to 100%. As previously noted, the door may include a handle or lever for use by the technician in closing the door manually if needed.

When the fan tray 16 is placed back in the fan tray slot, the fan speed will be reduced because the system detects that the door is open (steps 66 and 62). During this time, without air flow, the fan tray is very easy to insert since it is easier to insert the fan tray when there is no airflow. Once inserted, the system detects the fan tray and the process is terminated until the next module OIR. The fan speed may resume at its normal operating speed.

It is to be understood that the processes shown in FIGS. 5 and 6 and described above are only examples and that steps may be modified, added, or removed, without departing from the scope of the embodiments.

Figure 7:
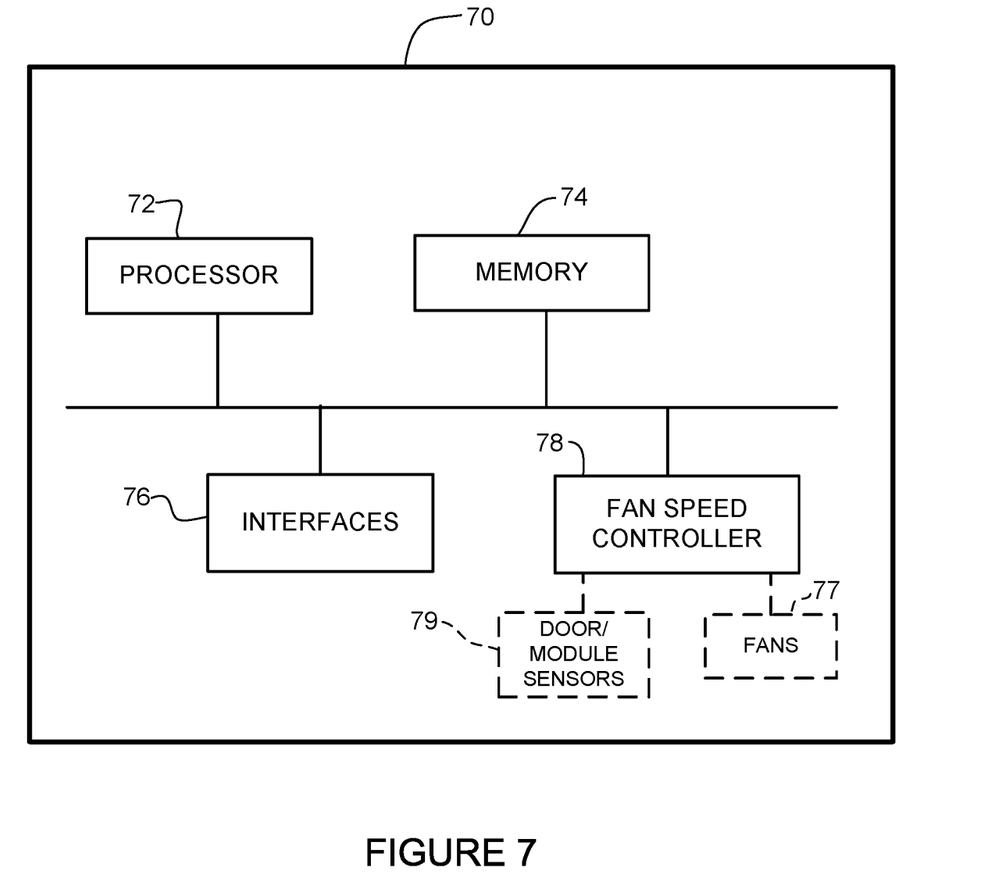
FIG. 7 is a block diagram depicting an example of a network device that may be used to implement the embodiments described herein.

FIG. 7 illustrates an example of a network device 70 (e.g., modular electronic system 10) that may be used to implement the embodiments described herein. In one embodiment, the network device 70 is a programmable machine that may be implemented in hardware, software, or any combination thereof. The network device 70 includes one or more processor 72, memory 74, network interfaces 76, and fan speed controller 78.

Memory 74 may be a volatile memory or non-volatile storage, which stores various applications, operating systems, modules, and data for execution and use by the processor 72. For example, components of the fan speed controller 78 (e.g., code, logic, software, firmware, etc.) may be stored in the memory 74. The network device 70 may include any number of memory components.

Logic may be encoded in one or more tangible media for execution by the processor 72. For example, the processor 72 may execute codes stored in a computer-readable medium such as memory 74. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The processor 72 may be operable to perform one or more steps shown in the flowcharts of FIG. 5 or 6, for example. The network device 70 may include any number of processors 72.

The fan speed controller 78 may comprise one or more components (software, code, logic) operable to monitor module presence, receive input from door and module sensors 79 (e.g., fan tray sensor 44, door closure switch 45, light sensor 46, air flow sensor 47, OIR button, or other sensor or element used to provide information or status of the fan tray or door) (FIGS. 4B and 7) and based on this input, modify speed of the fans 77.

The network interfaces 76 may comprise any number of interfaces (connectors, line cards, ports) for receiving data or transmitting data to other devices. The network interface 76 may include, for example, an Ethernet interface located on one of the line cards for connection to a computer or network.

It is to be understood that the network device 70 shown in FIG. 7 and described above is only an example and that different configurations of network devices may be used. For example, the network device 70 may further include any suitable combination of hardware, software, algorithms, processors, devices, components, or elements operable to facilitate the capabilities described herein.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. A method comprising:
    identifying removal of a module from a network device comprising a plurality of fans during an online removal process while the network device is operational;
    reducing fan speed in the network device to allow a hinged door to move to a closed position covering an opening from which the module was removed; and
    increasing the fan speed to maintain cooling in the network device.

2. The method of claim 1 wherein the module comprises a fan tray.

3. The method of claim 1 wherein a magnet maintains the door in said closed position when the fan speed increases.

4. The method of claim 1 further comprising verifying the hinged door is in said closed position and reducing the fan speed if the door is open.

5. The method of claim 4 wherein verifying the hinged door is in said closed position comprises monitoring air flow outside of said opening or sensing light within said opening.

6. The method of claim 1 wherein reducing the fan speed comprises reducing the fan speed for a specified period of time.

7. The method of claim 1 further comprising waiting a set period of time after identifying removal of the module before reducing the fan speed.

8. The method of claim 1 wherein reducing the fan speed comprises reducing the fan speed until receiving an indication that the hinged door is in said closed position.

9. The method of claim 1 further comprising receiving an indication that the hinged door is open after increasing the fan speed and reducing the fan speed to allow the hinged door to move to said closed position.

10. The method of claim 1 wherein reducing the fan speed comprises stopping or reducing the speed of at least one of said plurality of fans in the network device.

11. The method of claim 1 further comprising displaying an indication that the hinged door is in said closed position or an open position.

12. Logic encoded on one or more non-transitory computer readable media for execution and when executed by a processor operable to:
    identify removal of a module from a network device comprising a plurality of fans during an online removal process while the network device is operational;
    reduce fan speed in the network device to allow a hinged door covering an opening from which the module was removed to move to a closed position; and
    increase the fan speed to maintain cooling in the network device.

13. The logic of claim 12 further comprising logic for changing a status of an indicator light on the network device to indicate that the door is in said closed position.

14. The logic of claim 12 wherein the logic is operable to receive an indication that the hinged door is open after increasing the fan speed, and reduce the fan speed to allow the hinged door to move to said closed position.

15. The logic of claim 12 wherein the fan speed is reduced for a specified period of time.

16. The logic of claim 12 wherein the fan speed is reduced until an indication is received that the door is in said closed position.

17. The logic of claim 12 wherein the module comprises a fan tray.

18. A method comprising:
    receiving an indication at a network device of initiation of online removal for a module removably inserted into an opening in the network device, the network device comprising a plurality of fans;
    reducing a speed of at least one of the fans to allow removal of the module from the network device; and
    increasing the speed of said at least one of the fans to maintain cooling in the network device.

19. The method of claim 18 further comprising detecting closure of a door covering said opening from which the module is removed before increasing the fan speed.

20. The method of claim 18 wherein increasing the speed of said at least one of the fans comprises waiting a specified period of time before increasing the speed.

* * * * *